United States Patent [19]
Cake et al.

[11] Patent Number: 5,621,408
[45] Date of Patent: Apr. 15, 1997

[54] DELTA SIGMA ANALOG-TO-DIGITAL CONVERTER WITH TEMPORALLY INTERLEAVED ARCHITECTURE

[75] Inventors: Brian V. Cake, Sea Girt, N.J.; Jean-Francois Goumaz, Geneva, Switzerland; Walter O. LeCroy, Nyack, N.Y.

[73] Assignee: LeCroy Corporation, Chestnut Ridge, N.Y.

[21] Appl. No.: 394,427

[22] Filed: Feb. 24, 1995

[51] Int. Cl.$^6$ .................................. H03M 3/00
[52] U.S. Cl. ............................ 341/143; 341/155
[58] Field of Search .......................... 341/143, 155

[56] References Cited

U.S. PATENT DOCUMENTS 4,888,587  12/1989  Kuraishi ............................ 341/122
5,030,954  7/1991  Ribner ............................... 341/172
5,329,282  7/1994  Jackson ............................. 341/143

OTHER PUBLICATIONS

Research Disclosure (Disclosed Anonymously) *Decision Switch for a Delta or Sigma–Delta Modulator*, No. 325, May 1991, pp. 367–368.

*Primary Examiner*—Jeffrey A. Gaffin
*Assistant Examiner*—Peguy JeanPierre
*Attorney, Agent, or Firm*—Curtis Morris & Safford P.C.

[57] ABSTRACT

A delta sigma converter according to the present invention replaces the quantizer of a conventional delta sigma converter, such as a comparator followed by a latch, with N quantizers, each operating at a reduced frequency $f_s/N$ and phase offset from each other by $2\pi/N$. The quantized outputs are assembled in accordance with a control signal to produce a feedback signal at a frequency $f_s$ and the feedback signal is applied to a subtractor of the delta sigma converter.

15 Claims, 5 Drawing Sheets

DELTA SIGMA ANALOG-TO-DIGITAL CONVERTER WITH TEMPORALLY INTERLEAVED ARCHITECTURE

BACKGROUND OF THE INVENTION

The present invention relates to analog to digital conversion, and, more particularly, is directed to a delta sigma type of analog to digital converter.

Delta sigma converters, also referred to as sigma delta modulators, convert a signal amplitude into digital data. An input signal at a given frequency $f_0$ is oversampled, that is, sampled at a rate $f_s$ much higher than the Nyquist rate, $f_s \gg 2f_0$. When the delta sigma converter employs one-bit quantization, the output signal comprises a one-bit data pulse stream having a time average amplitude proportional to the amplitude of the input signal.

Quantization of the input signal introduces errors, that is, noise, into the output signal. A major advantage of delta sigma converters is their ability to shape the quantization noise spectrum, specifically, to move the noise from low frequencies into high frequencies. The output data is then low pass filtered to remove the noise.

Figure 1:
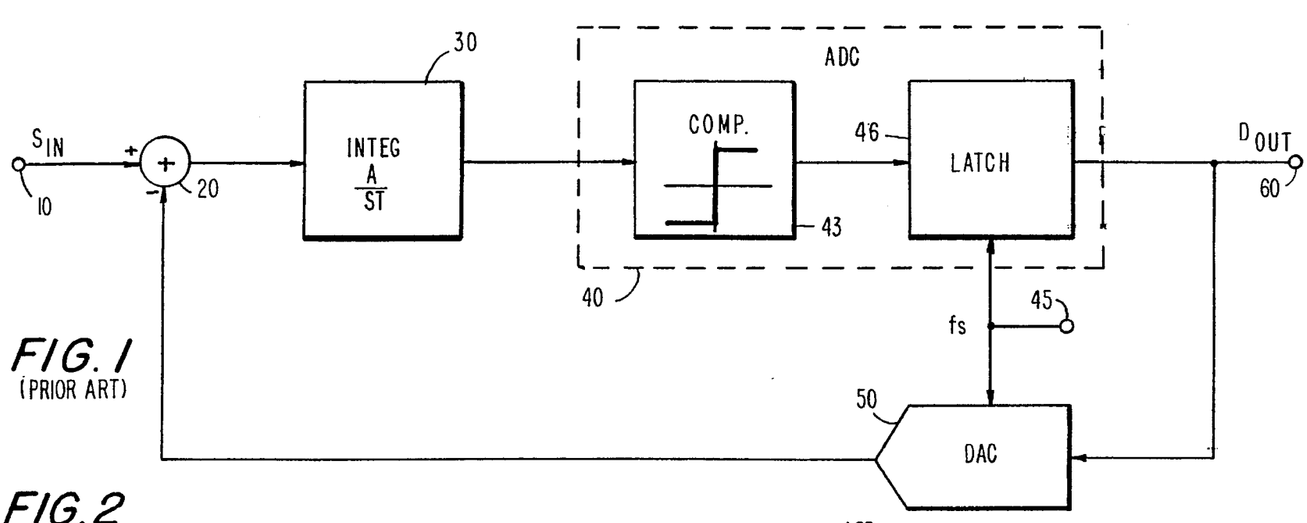
FIG. 1 is a block diagram of a first order delta sigma converter.

A single bit first order delta sigma converter is shown in FIG. 1 as including subtractor 20, integrator 30, analog-to-digital converter 40 comprising comparator 43 and latch 46, and digital to analog converter 50.

An input signal $S_{IN}$ having a maximum frequency $f_0$ is applied to an input terminal 10 which supplies the signal $S_{IN}$ to subtractor 20. The subtractor 20 subtracts a feedback signal from the present input signal to produce a difference signal, and applies the difference signal to an integrator 30.

The integrator 30 functions to add the difference signal to the sum of previous difference signals so as to generate an integrated signal, and to supply the integrated signal to a comparator 43.

The comparator 43 is operative to coarsely quantize the integrated signal into one of two levels, and to supply the quantized signal to a latch 46. The latch 46 also receives a control signal at the sampling frequency $f_s$ from a clock generator (not shown) via input terminal 45, and is adapted to sample the quantized signal in response to the control signal and to supply the sampled value as an output $D_{OUT}$ to an output terminal 60 and to a digital to analog converter (DAC) 50. Alternatively, the comparator 43 finely quantizes the integrated signal to produce an output signal exhibiting more than two levels.

The DAC 50 receives the output signal $D_{OUT}$ and the control signal at the sampling frequency $f_s$, and functions to convert the value $D_{OUT}$ to one of two output signal levels, and to supply the result as the feedback signal to the subtractor 20. The feedback ensures that the average value of the quantized signal tracks the average input.

As explained in James C. Candy et al., *Oversampling Delta-Sigma Data Converters*, IEEE Press, 1992, pages 2–7, for a first order delta sigma modulator, the rms noise $n_0$ in the signal band $f_0$ is given by:

$$n_0^{1st\ order} = e_{rms}(\pi^2/3)^{1/2}(2f_0/f_s)^{3/2} \qquad (eq.\ 1)$$

where $e_{rms}$ is the rms quantization error. Doubling the sampling frequency of a first order delta sigma converter decreases the in-band noise by 9 dB, corresponding to an increase in resolution of 1.5 bits.

The architecture of a first order delta sigma converter is fairly simple. Relatively imprecise circuit components can be used due to the presence of the feedback loop.

Figure 2:
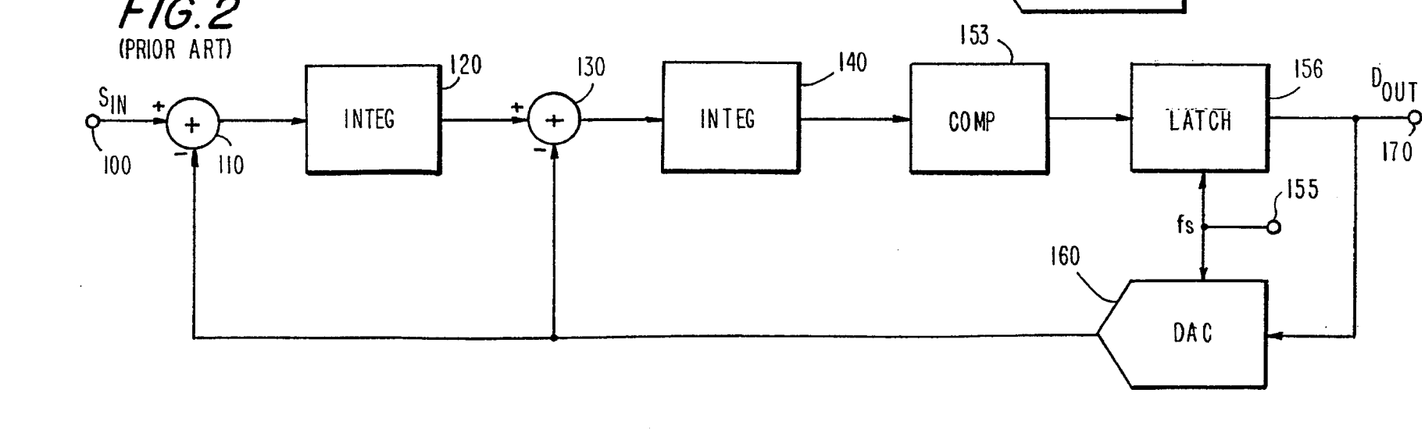
FIG. 2 is a block diagram of a second order delta sigma converter.

A second order delta sigma converter is shown in FIG. 2 as comprising subtractors 110, 130, integrators 120, 140, comparator 153, latch 156 and DAC 160. The second order delta sigma converter is generally similar to the first order delta sigma converter, except that the feedback signal is supplied to an "outer" subtractor 110 where it is combined with the input signal, and then integrated, before being applied to an "inner" subtractor 130.

An inner path comprising subtractor 130, integrator 140, comparator 153, latch 156 and DAC 160 serves to stabilize the system, and to determine the high frequency properties of the system. An outer path including subtractor 110 and integrator 120 dominates in determining the low frequency properties of the system.

For a second order delta sigma modulator, the rms noise $n_0$ in the signal band $f_0$ is given by:

$$n_0^{2nd\ order} = e_{rms}(\pi^4/5)^{1/2}(2f_0/f_s)^{5/2} \qquad (eq.\ 2)$$

Doubling the sampling frequency of a second order delta sigma converter decreases the in-band noise by 15 dB, corresponding to an increase in resolution of 2.5 bits.

Relative to the first order delta sigma converter, the second order delta sigma converter is seen to reduce the quantization noise, permitting improved resolution. However, the second order delta sigma converter is less stable and less tolerant of component imprecision.

Delta sigma converters are generally used only with low frequency input signals, typically voice signals, due to the need for a high sampling frequency, specifically, a sampling rate up to several orders of magnitude higher than the Nyquist rate. For input signals of medium frequencies, components operating at an appropriately high sampling frequency are expensive. For input signals of high frequencies, components operating at an appropriately high sampling frequency are unavailable.

To achieve an effective sampling frequency of $f_s$ using components operating at a lower sampling frequency, it has been proposed to interleave two separate delta sigma converters each operating at $f_s/2$, with the clock signals for the delta sigma converters being offset. Unfortunately, the oversampling ratio $f_s/f_0$ for each of these delta sigma converters is reduced by half, so the in-band noise for each of the delta sigma converters in the interleaved structure is increased by 9 dB relative to a single delta sigma converter operating at $f_s$. Additionally, due to the noise from each delta sigma converter adding in quadrature, if uncorrelated, the in-band noise increases by an additional 3 dB. Overall, the noise increases by 12 dB for this scheme of interleaved delta sigma converters, corresponding to a reduction in resolution of 2 bits, relative to a single conventional delta sigma converter. Therefore, this proposed scheme is not effective.

OBJECTS AND SUMMARY OF THE INVENTION

Therefore, an object of the present invention is to provide a delta sigma converter which avoids the aforementioned disadvantages of the prior art.

Another object of the present invention is to provide a delta sigma converter capable of using slower components to provide an appropriately high sampling rate.

A further object of the present invention is to provide a delta sigma converter with reduced manufacturing costs.

Yet another object of the present invention is to provide an analog to digital converter having a simple structure and which can be used with a high frequency input signal.

Still another object of the present invention is to provide an analog to digital converter which demultiplexes its output signal into a set of lower frequency signals.

In accordance with an aspect of this invention, method and apparatus are provided for converting an analog input signal to at least two digital output signals. A feedback signal is subtracted from the analog input signal to produce a difference signal which is integrated and the integrated signal is quantized to produce the at least two digital output signals in response to respective control signals each having a predetermined frequency and being offset in phase from each other. The at least two digital output signals are converted into the feedback signal.

The above, and other objects, features and advantages of the present invention will be apparent from the following detailed description of the preferred embodiments of the present invention when read in conjunction with the accompanying drawings.

DETAILED DESCRIPTION OF THE PREFERRED EMBODIMENTS

A delta sigma converter according to the present invention replaces the quantizer of a conventional delta sigma converter, such as a comparator followed by a latch, with N quantizers, each operating at a reduced frequency $f_s/N$ and phase offset from each other by $2\pi/N$ radians. The quantized outputs are assembled in a digital to analog converter (DAC) in accordance with a control signal at a frequency $f_s$ to produce the feedback signal applied to the subtractor of the delta sigma converter.

Consequently, a delta sigma converter according to the present invention can use components operating at a lower frequency than the sampling frequency $f_s$ without loss of dynamic range relative to a conventional delta sigma converter.

Advantages of a delta sigma converter relative to a flash ADC include fewer components, and consequently lower cost, reduced power requirements and greater reliability, that is, lower output error probability. For example, an eight bit flash ADC requires 255 comparators to produce 255 levels which are converted into eight bits by an encoder having substantial amounts of logic and latches.

Figures 3, 4A, 4B, 4C:
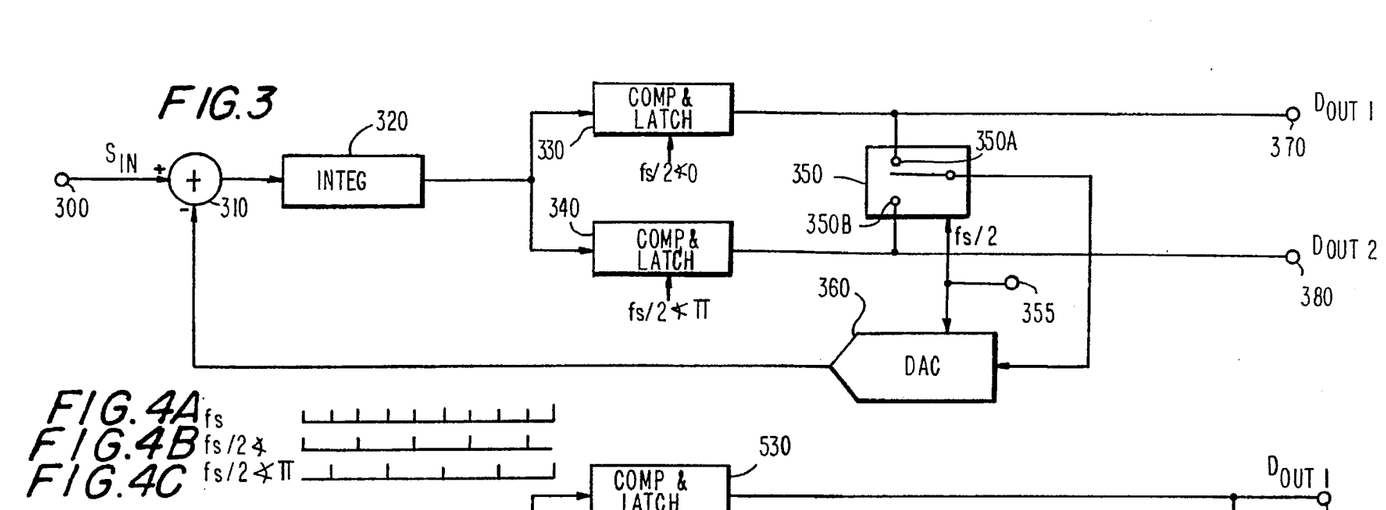
FIG. 3 is a block diagram of a delta sigma converter according to the present invention.
FIGS. 4A–4C are timing charts showing the relationship of the sampling frequencies used in the delta sigma converter of FIG. 3.

Referring now to the drawings, and in particular to FIG. 3, there is illustrated an embodiment of a delta sigma converter according to the present invention. The apparatus illustrated in FIG. 3 comprises subtractor 310, integrator 320, sampling comparators 330, 340, switch 350 and DAC 360.

An input signal $S_{IN}$ is applied to an input terminal 300 which supplies the signal $S_{IN}$ to subtractor 310. The subtractor 310 functions to subtract a feedback signal from the current input signal to produce a difference signal, and applies the difference signal to an integrator 320. The integrator 320 functions to add the difference signal to the sum of previous difference signals so as to generate an integrated signal, and to supply the integrated signal to sampling comparators 330, 340.

The sampling comparators 330, 340 are each operative to coarsely quantize the integrated signal into one of two levels, to sample the quantized signal in response to the control signal at a sampling frequency of $f_s/2$ and to supply the respective sampled values as outputs $D_{OUT1}$, $D_{OUT2}$ to output terminals 370, 380, respectively, and to switch 350.

The sampling clock signals supplied to the comparators 330, 340 are interleaved in time. As shown in FIGS. 4A–4C, the sampling clock signal supplied to comparator 330 represents the odd pulses of the sampling clock signal $f_s$, while the sampling clock signal supplied to comparator 340 represents the even pulses of the sampling clock signal $f_s$. Alternatively, the sampling clock signal supplied to comparator 330 may be delayed by 180° to produce the sampling clock signal supplied to comparator 340.

The switch 350 receives the output signals $D_{OUT1}$, $D_{OUT2}$, each sampled at a rate of $f_s/2$ and also receives a control signal at the frequency $f_s/2$ from an input terminal 355, and is adapted to alternately select the quantized values $D_{OUT1}$, $D_{OUT2}$ at twice the rate of the control signal. For example, the control signal may be inverted, with one terminal providing a positive pulse of the non-inverted signal and another terminal providing a positive pulse of the inverted signal. The output of switch 350 thus is a signal at the desired sampling frequency $f_s$, although each of the sampling comparators 330, 340 operates at a rate of $f_s/2$.

The DAC 360 receives the switched outputs $D_{OUT1}$, $D_{OUT2}$ and the control signal at the sampling frequency $f_s$, and functions to convert the values $D_{OUT1}$, $D_{OUT2}$ to one of two output signal levels, and to supply the result as the feedback signal to the subtractor 310.

Figure 5:
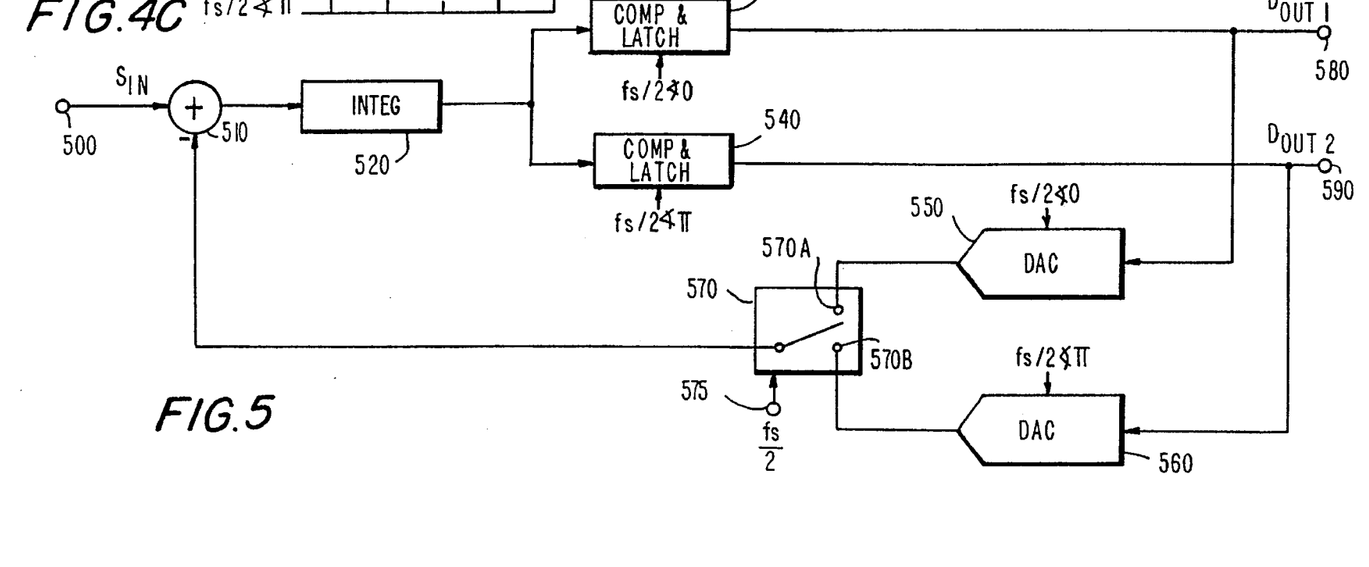
FIG. 5 is a block diagram of another delta sigma converter according to the present invention.

FIG. 5 illustrates another embodiment of a delta sigma converter according to the present invention. The apparatus illustrated in FIG. 5 comprises subtractor 510, integrator 520, sampling comparators 530, 540, DACs 550, 560 and switch 570.

The delta sigma converter of FIG. 5 operates in generally the same manner as the delta sigma converter of FIG. 3, except that the quantized outputs $D_{OUT1}$, $D_{OUT2}$ are supplied to DACs 550, 560, respectively, instead of to a switch. The DACs operate at the same frequency as the comparators, and are phase offset in the same manner. The outputs of the DACs 550, 560 are supplied to inputs 570A, 570B, respectively, of switch 570. A control signal at frequency $f_s/2$ is also supplied to the switch 570 from a clock signal generator (not shown) via input terminal 575. The switch 570 is operative to alternately select the outputs of the DACs 550, 560 to produce the feedback signal applied to subtractor 510.

In its general description, a delta sigma converter according to the present invention comprises N comparators, each operating at a frequency of $f_s/N$, and a switch having N inputs selected in turn at a rate of $f_s$. A delta sigma converter according to the present invention may also comprise N DACs, each operating at a frequency of $f_s/N$. The clock signals applied to the comparators and DACs are offset from each other by $2\pi/N$. For ease of illustration, FIGS. 3 and 5 show the case of N=2 for a first order delta sigma converter. For a higher order delta sigma converter, the feedback signal is supplied to another "outer" path including another subtractor and another integrator, as generally shown in FIG. 2.

If the comparators in a delta sigma converter according to the present invention are identical, then the outputs, when assembled, provide a signal having a signal to noise ratio which is indistinguishable from a conventional delta sigma converter having components operating at the sampling frequency $f_s$. Assembly of the outputs $D_{OUT1}$, $D_{OUT2}$ may be done by, for example, storing these values in alternate locations of a memory, such as addresses n, n+2, n+4, ... for the outputs $D_{OUT1}$, and addresses n+1, n+3, n+5, ... for the outputs $D_{OUT2}$, and then sequentially reading out the memory.

If the comparators in a delta sigma converter according to the present invention are not identical, then the assembled outputs exhibit an error signal at the frequency $f_s/N$, which can readily be eliminated by bandpass filtering the composite signal. For example, when the assembled outputs are $D_{OUT1}(n)$, $D_{OUT2}(n+1)$, $D_{OUT1}(n+2)$, $D_{OUT2}(n+3)$, ..., the filtering may comprise averaging pairs of adjacent assembled outputs to produce filtered outputs $(D_{OUT1}(n)+D_{OUT2}(n+1))/2$, $(D_{OUT2}(n+1)+D_{OUT1}(n+2))/2$, $(D_{OUT1}(n+2)+D_{OUT2}(n+3))/2$, ...

A delta sigma converter according to the present invention may operate to quantize the integrated signal to more than two levels by using, for example, a flash A/D converter, instead of a comparator. In this case, positioning of the quantization thresholds must be considered.

Assuming an input signal of frequency $f_0$=500 MHz, a sampling frequency $f_s$=10 GHz, and a latch which works properly only below 10 gigasamples per second, then a conventional delta sigma converter cannot be constructed. However, a delta sigma converter according to the present invention with two temporally interleaved latches is feasible. A delta sigma converter according to the present invention with four temporally interleaved latches is also feasible, and exhibits an increase in resolution of 2.5 bits for a second order system. If eight temporally interleaved latches are used, then an increase in resolution of 5 bits is obtained for a second order system.

Thus, a delta sigma converter according to the present invention permits a tradeoff between number of components and resolution, with only a small increase in complexity relative to a conventional delta sigma converter. The conventional tradeoff between sampling frequency and resolution is available in a delta sigma converter according to the present invention.

In some applications it is advantageous to demultiplex the digital output of a delta sigma converter for subsequent processing. A delta sigma converter according to the present invention is seen to inherently produce demultiplexed digital outputs.

Figure 6:
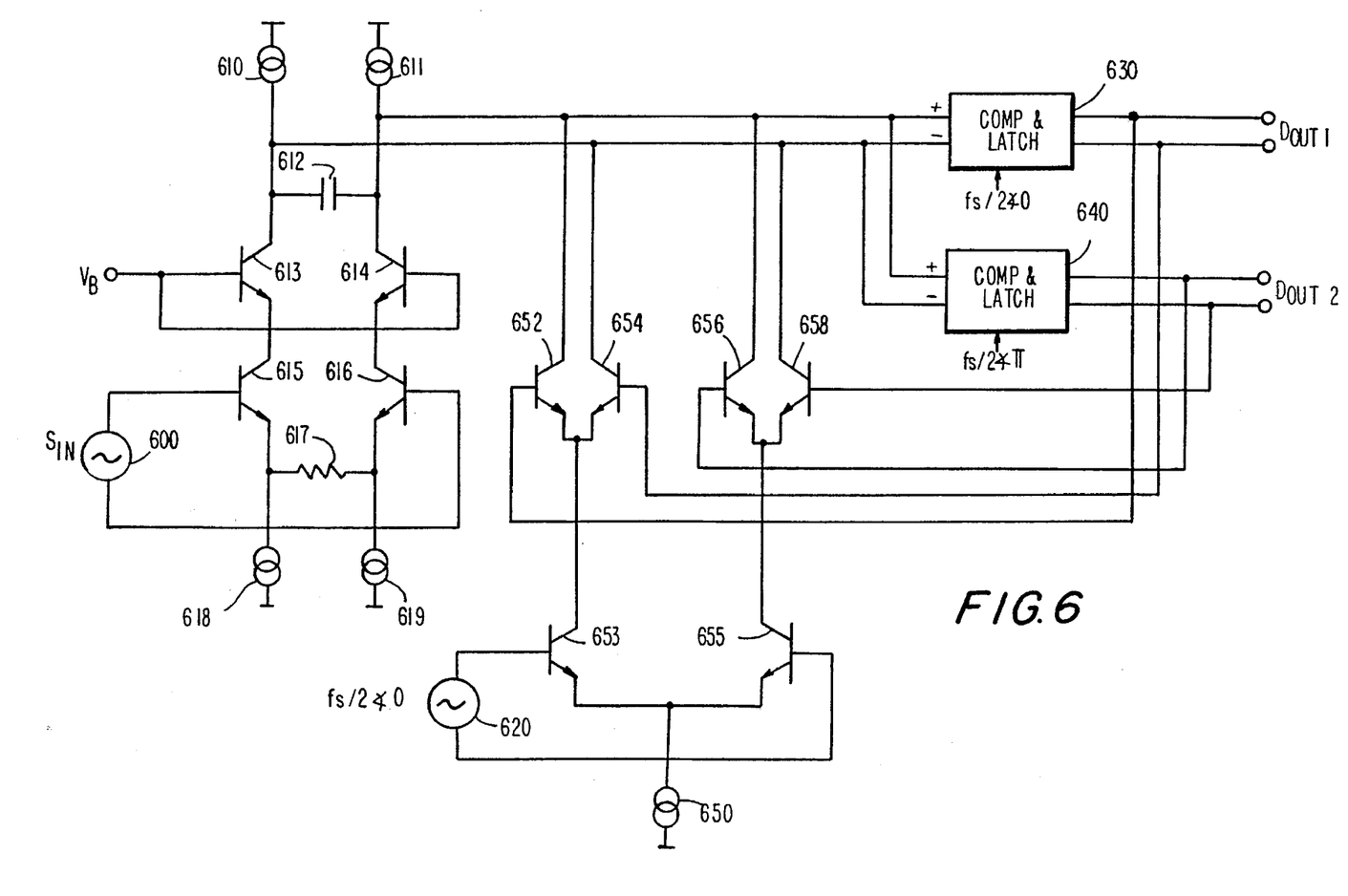
FIG. 6 is a diagram of yet another delta sigma converter according to the present invention.

FIG. 6 shows another embodiment of a delta sigma converter similar to the delta sigma converter of FIG. 5. In the delta sigma converter of FIG. 6, the DAC reference current is switched, whereas in the delta sigma converter of FIG. 5, the DAC outputs are switched. As explained below, the delta sigma converter of FIG. 6 requires a clock operating at only $f_s/2$ to achieve an effective switching rate of $f_s$.

The delta sigma converter of FIG. 6 comprises current sources 610, 611, 618, 619, 650, voltage source 620, capacitor 612, resistor 617, transistors 613, 614, 615, 616, 652, 653, 654, 655, 656, 658, and sampling comparators 630, 640.

Transistors 613, 614, 615, 616 form a cascade differential amplifier. The emitters of transistors 615, 616 are respectively connected to each of the terminals of resistor 617. The collectors of transistors 613, 614 are respectively connected to each of the terminals of capacitor 612, and the bases of transistors 613, 614 are connected in common to a bias voltage $V_B$.

The terminals of capacitor 612 are also connected to the collectors of transistors 652, 654, 656, 658. Transistors 652, 654 form a DAC and transistors 656, 658 form another DAC. The emitters of transistors 652, 654 are connected in common to the collector of transistor 653. The emitters of transistors 656, 658 are connected in common to the collector of transistor 655.

Transistors 653, 655 are adapted to switch the reference current of the DACs formed by transistors 652, 654 and 656, 658.

The terminals of capacitor 612 are additionally connected to positive and negative inputs of each of sampling comparators 630, 640. Comparator 630 is coupled to the DAC formed by transistors 652, 654, and comparator 640 is coupled to the DAC formed by transistors 656, 658.

The circuit consisting of transistors 613, 614, 615, 616, resistor 617 and current sources 610, 611, 618, 619 is a differential transconductance circuit which functions to convert the input signal Sin into a differential current which is output from the collectors of transistors 613 and 614. A feedback current signal from the DACs, phased such that the feedback is negative, is also applied to the capacitor 612.

Capacitor 612 is adapted to sum the negative feedback current signal with the input current signal and a signal already present on the capacitor, and to supply the result as an integrated signal to comparators 630, 640.

The comparators 630, 640 function to quantize the integrated signal, that is, to compare the integrated signal with a predetermined threshold, to produce one value if the signal is at least equal to the threshold and another value if the signal is less than the threshold, and to hold the resulting value until the next sampling instant.

Transistors 653, 655 act to switch, that is, to enable or disable the DAC transistor pairs 652, 654 and 656, 658.

When transistor 653 is enabled by the sampling clock signal 620, current from current source 650 flows to the common emitters of transistors 652, 654. If $D_{OUT1}$ is a logic "0", then all current from source 650 flows through the collector of transistor 654. If $D_{OUT1}$ is a logic "1", then all current from source 650 flows through the collector of transistor 652. Thus, the feedback signal corresponds to the value $D_{OUT1}$ from comparator 630.

Provision of phasing so that the feedback signal is negative is accomplished as follows. Let it be assumed that the input to the comparators is such that the "+" input is more positive than the "−" input. This is transferred to the latch as a logical "1", so transistor 652 is "on" and transistor 654 is "off", and the current in the collector of transistor 652 acts to reduce the potential at the comparator "+" input, thus forming a negative feedback connection.

Similarly, when transistor 655 is enabled by the sampling clock signal 620, current from current source 650 flows to the common emitters of transistors 656, 658. If $D_{OUT1}$ is a logic "0", then all current flows through the collector of transistor 658. If $D_{OUT2}$ is a logic "1", then all current flows through the collector of transistor 656. Thus, the feedback signal corresponds to the value $D_{OUT2}$ from comparator 640.

The sampling clock signal 620 may be thought of as having a period including a positive edge and a negative edge. While the rate of the sampling clock signal is determined by the positive going edge in each period, the effective switching rate of the DACs is determined by the positive and negative edges in a period, since the positive edge enables transistor 653 while the negative edge enables transistor 655. Thus, a clock signal having a rate of $f_s/2$ provides an effective switching rate of $f_s$ in the configuration of FIG. 6.

Figures 7, 8A, 8B, 8C:
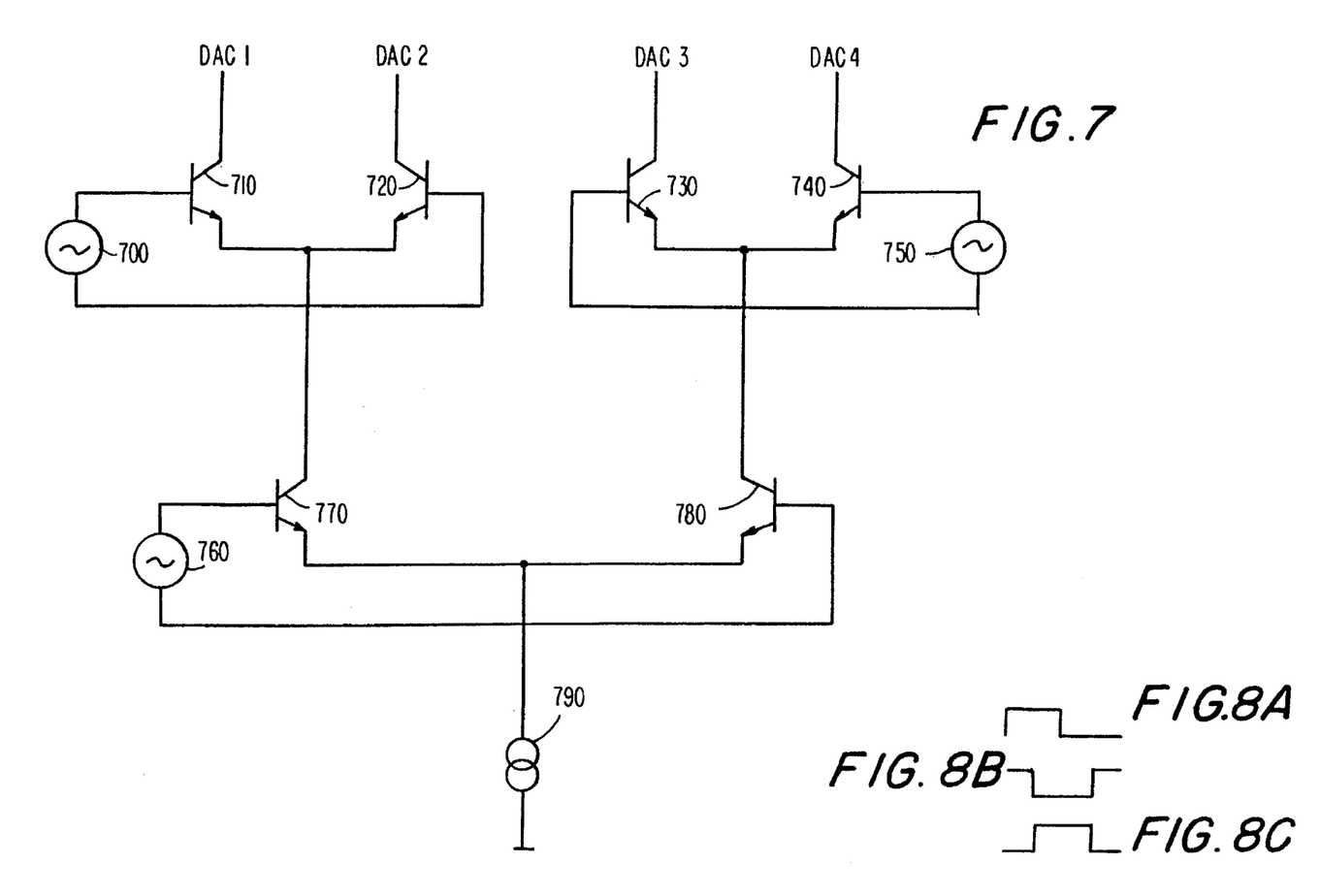
FIG. 7 is a diagram of a portion of a further delta sigma converter according to the present invention.
FIGS. 8A–8C are timing charts referred to in explaining the operation of the delta sigma converter shown in FIG. 7.

The configuration of FIG. 6 may readily be extended to four comparators each operating at a rate of $f_s/4$, and four DAC transistor pairs respectively connected between the outputs of the comparators and a capacitor in a cascode configuration. FIG. 7 shows the corresponding extension of the circuit portion which switches the reference current for the DAC transistor pairs so that only one of the comparator outputs is fed back to the summing capacitor.

FIG. 7 comprises clock signal sources 700, 750, 760, transistors 710, 720, 730, 740, 770, 780, and current source 790. The collectors of transistors 710, 720, 730, 740 are respectively connected to the common emitters of the transistors in the transistor pairs forming the four DACs.

Clock signal 760 has a frequency of $f_s/4$. During the "positive pulse" portion of each period having a duration of $2\tau$, transistor 770 is enabled and so current from current source 790 flows to the common emitters of transistors 710, 720. Clock signal 700 has a frequency of $f_s/2$. During the "positive pulse" portion of each period having a duration of $\tau$, transistor 710 is enabled so that a first comparator output is fed back through DAC1. During the "negative pulse" portion of each period, also having a duration of $\tau$, transistor 720 is enabled so that a second comparator output is fed back through DAC2.

During the "negative pulse" portion of each period of clock signal 760, also having a duration of $2\tau$, transistor 780 is enabled and so current from current source 790 flows to the common emitters of transistors 730, 740. Clock signal 750 also has a frequency of $f_s/2$. During the "positive pulse" portion of each period, transistor 730 is enabled so that a third comparator output is fed back through DAC3, and during the "negative pulse" portion of each period, transistor 740 is enabled so that a fourth comparator output is fed back through DAC4.

Alternatively, the clock signal 760 may have a frequency of $f_s/4$ and a phase of 0°, the clock signal 700 may have a frequency of $f_s/4$ and a phase of 270°, and the clock signal 750 may have a frequency of $f_s/4$ and a phase of 90°, as shown in FIGS. 8A-8C. Thus, to achieve an effective feedback signal rate of $f_s$, a maximum clock signal rate of only $f_s/4$ is required. Generally, to achieve an effective feedback signal rate of $f_s$, a maximum clock signal rate of only $f_s/N$ is required, where N is the number of comparators and corresponding DAC transistor pairs.

Applications for the present invention include digital sampling oscilloscopes, modular test and instrumentation systems, applications where portability or battery powered operation are important, and generally any situation where conversion of an analog signal to a digital signal is required.

Figure 9:
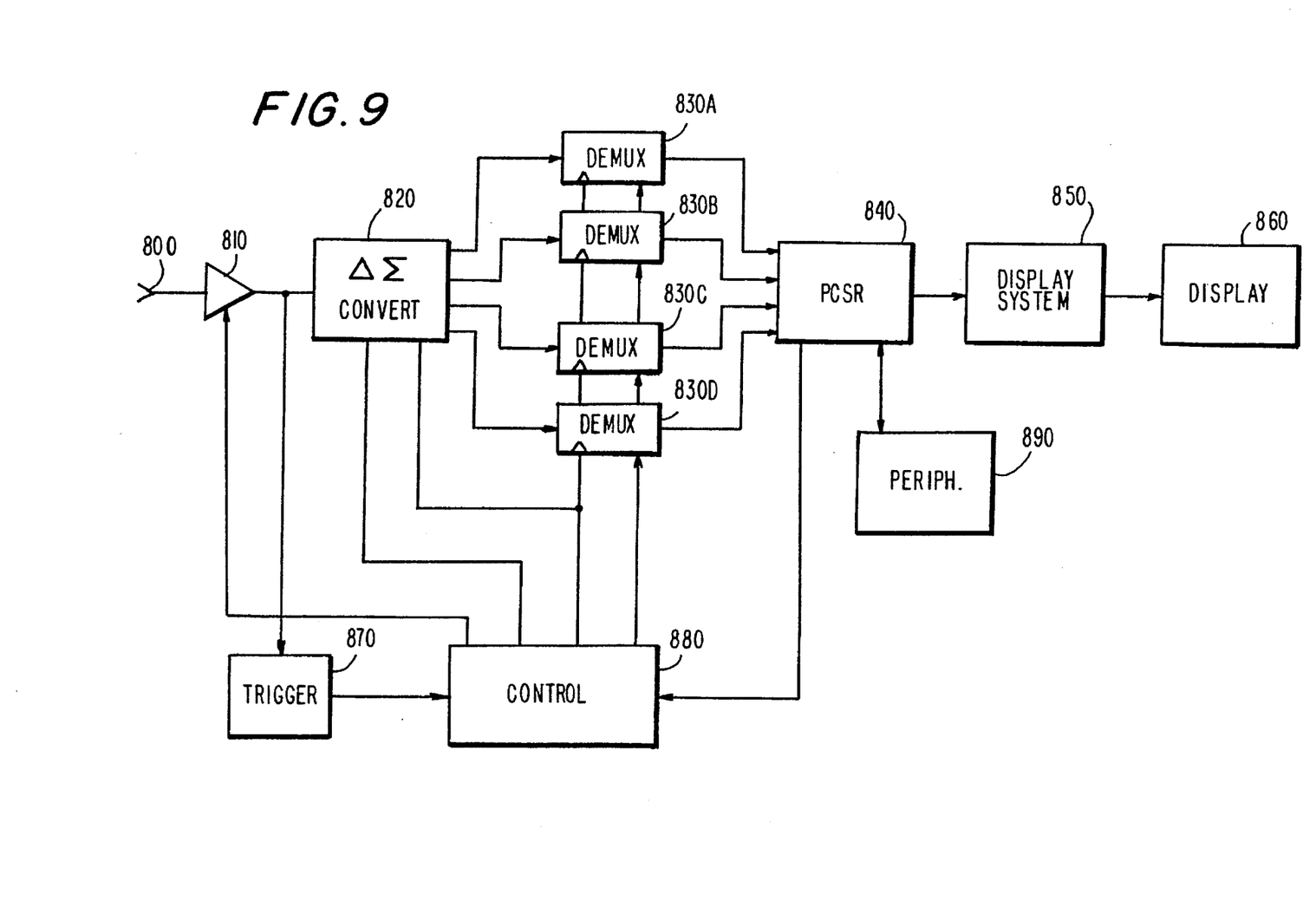
FIG. 9 shows a digital sampling oscilloscope incorporating a delta sigma converter according to the present invention.

FIG. 9 shows a digital sampling oscilloscope incorporating a delta sigma converter according to the present invention.

An input signal is supplied to terminal 800 which applies the input signal to signal conditioner 810 that functions to amplify, offset and otherwise suitably condition the input signal in a conventional manner, and to supply the conditioned signal to delta sigma converter 820 and to trigger processor 870.

Controller 880 is adapted to generate clock signals suitable for the timebase of the input and output signals, and to supply these clock signals to delta sigma converter 820 and demultiplexers 830A-D. Controller 880 also generates write and read control signals for memories included in the demultiplexers 830A-D.

Delta sigma converter 820 functions to convert the conditioned input signal into digital data pulse streams having a combined time average amplitude proportional to the amplitude of the input signal, and to supply the digital data to demultiplexers 830A-D.

Demultiplexers 830A-D respectively include a memory for storing the digital data supplied thereto in accordance with clock pulses and write control signals supplied thereto from controller 880. The demultiplexers are needed only when the data rate from the converter is too fast for the memories to accommodate directly.

Trigger processor 870 is adapted to detect a trigger indication in the conditioned input signal, and to supply a halt signal to controller 880 upon detection of the trigger indication. Controller 880 serves to respond to the halt signal from trigger processor 870 by generating a control signal to delta sigma converter 820 to halt signal conversion, and generating a read control signal to demultiplexers 830A-D to transfer their contents to processor 840.

Additionally, when data is transferred from demultiplexers 830A-D to processor 840, the data may be pre-processed by, for example, filtering as described above, or by conditioning to a form suitable for display. The filtering may be performed by processor 840 or by a dedicated digital signal processor.

Processor 840 is adapted to combine the signals read out from the memories in demultiplexers 830A-D, as filtered or conditioned, to form a display signal and to supply the display signal to display system 850 which stores and suitably formats the display signal for display on display 860.

Although illustrative embodiments of the present invention, and various modifications thereof, have been described in detail herein with reference to the accompanying drawings, it is to be understood that the invention is not limited to these precise embodiments and the described modifications, and that various changes and further modifications may be effected therein by one skilled in the art without departing from the scope or spirit of the invention as defined in the appended claims.

What is claimed is:

1. An analog to digital converter for converting an analog input signal to at least two digital output signals, comprising:

subtracting means for subtracting a feedback signal from said analog input signal to produce a difference signal;

integrating means for integrating said difference signal to produce an integrated signal;

quantizing means for quantizing said integrated signal to produce said at least two digital output signals in response to respective control signals each having a predetermined frequency and being offset in phase from each other; and means for converting said at least two digital output signals into said feedback signal, wherein said feedback signal has a first frequency, and said predetermined frequency is said first frequency divided by the number of said digital output signals.

2. An analog to digital converter for converting an analog input signal to at least two digital output signals, comprising:

subtracting means for subtracting a feedback signal from said analog input signal to produce a difference signal;

integrating means for integrating said difference signal to produce an integrated signal;

quantizing means for quantizing said integrated signal to produce said at least two digital output signals in response to respective control signals each having a predetermined frequency and being offset in phase from each other; and     means for converting said at least two digital output signals into said feedback signal, said means for converting comprising switch means for selecting between said at least two digital output signals to produce a composite output signal, and conversion means for converting said composite output signal to said feedback signal.

3. An analog to digital converter for converting an analog input signal to at least two digital output signals, comprising:

subtracting means for subtracting a feedback signal from said analog input signal to produce a difference signal;

integrating means for integrating said difference signal to produce an integrated signal;

quantizing means for quantizing said integrated signal to produce said at least two digital output signals in response to respective control signals each having a predetermined frequency and being offset in phase from each other; and     means for converting said at least two digital output signals into said feedback signal, said means for converting comprising at least two conversion means for respectively converting said at least two digital output signals to at least two converted signals, and switch means for selecting between said converted signals to produce said feedback signal.

4. An analog to digital converter for converting an analog input signal to at least two digital output signals, comprising:

subtracting means for subtracting a feedback signal from said analog input signal to produce a difference signal;

integrating means for integrating said difference signal to produce an integrated signal;

quantizing means for quantizing said integrated signal to produce said at least two digital output signals in response to respective control signals each having a predetermined frequency and being offset in phase from each other, said means for quantizing comprising comparison means for comparing said integrated signal with at least one predetermined threshold and for providing said digital output signals in accordance with the comparison; and     means for converting said at least two digital output signals into said feedback signal.

5. The converter of claim 4, wherein said means for quantizing further comprises latch means for respectively storing said at least two digital output signals in response to said control signals.

6. An analog to digital converter for converting an analog input signal to at least two digital output signals, comprising:

subtracting means for subtracting a feedback signal from said analog input signal to produce a difference signal;

integrating means for integrating said difference signal to produce an integrated signal;

quantizing means for quantizing said integrated signal to produce said at least two digital output signals in response to respective control signals each having a predetermined frequency and being offset in phase from each other; and     means for converting said at least two digital output signals into said feedback signal, said means for converting comprising at least two conversion means for respectively converting said digital output signals to converted signals, switch means for selectively enabling said at least two conversion means, and means for combining said converted signals, as produced by the selectively enabled conversion means, to form said feedback signal.

7. The converter of claim 6, wherein said switch means is responsive to said predetermined frequency and includes means for producing a clock signal having said predetermined frequency.

8. A method for converting an analog input signal to at least two digital output signals, comprising the steps of:

subtracting a feedback signal from said analog input signal to produce a difference signal;

integrating said difference signal to produce an integrated signal;

quantizing said integrated signal to produce said at least two digital output signals in response to respective control signals each having a predetermined frequency and being offset in phase from each other; and     converting said at least two digital output signals into said feedback signal, wherein said feedback signal has a first frequency, and said predetermined frequency is said first frequency divided by the number of said digital output signals.

9. A method for converting an analog input signal to at least two digital output signals, comprising the steps of:

subtracting a feedback signal from said analog input signal to produce a difference signal;

integrating said difference signal to produce an integrated signal;

quantizing said integrated signal to produce said at least two digital output signals in response to respective control signals each having a predetermined frequency and being offset in phase from each other; and     converting said at least two digital output signals into said feedback signal by selecting between said at least two digital output signals to produce a composite output signal, and converting said composite output signal to said feedback signal.

10. A method for converting an analog input signal to at least two digital output signals, comprising the steps of:

subtracting a feedback signal from said analog input signal to produce a difference signal;

integrating said difference signal to produce an integrated signal;

quantizing said integrated signal to produce said at least two digital output signals in response to respective control signals each having a predetermined frequency and being offset in phase from each other; and     converting said at least two digital output signals into said feedback signal by respectively converting said at least two digital output signals to at least two converted signals, and selecting between said converted signals to produce said feedback signal.

11. A method for converting an analog input signal to at least two digital output signals, comprising the steps of:

subtracting a feedback signal from said analog input signal to produce a difference signal;

integrating said difference signal to produce an integrated signal;

quantizing said integrated signal to produce said at least two digital output signals in response to respective control signals each having a predetermined frequency and being offset in phase from each other, said step of quantizing comprising the steps of comparing said integrated signal with at least one predetermined threshold and providing said digital output signals in accordance with the comparison; and converting said at least two digital output signals into said feedback signal.

12. The method of claim 11, wherein said step of quantizing further comprises respectively storing said at least two digital output signals in response to said control signals.

13. A method for converting an analog input signal to at least two digital output signals, comprising the steps of:

subtracting a feedback signal from said analog input signal to produce a difference signal;

integrating said difference signal to produce an integrated signal;

quantizing said integrated signal to produce said at least two digital output signals in response to respective control signals each having a predetermined frequency and being offset in phase from each other; and converting said at least two digital output signals into said feedback signal by selectively converting said digital output signals to converted signals, and combining said converted signals to form said feedback signal.

14. The method of claim 13, wherein said step of combining is responsive to said predetermined frequency and includes producing a clock signal having said predetermined frequency.

15. A digital sampling oscilloscope, comprising:

an analog to digital converter including subtracting means for subtracting a feedback signal from said analog input signal to produce a difference signal, integrating means for integrating said difference signal to produce an integrated signal, quantizing means for quantizing said integrated signal to produce said at least two digital output signals in response to respective control signals each having a predetermined frequency and being offset in phase from each other, and means for converting said at least two digital output signals into said feedback signal;

memory means for storing said at least two digital output signals;

processor means for combining the stored digital output signals to produce a display signal; and display means for displaying said display signal.

* * * * *